United States Patent
Furukawa (10) Patent No.: US 11,610,962 B2
(45) Date of Patent: Mar. 21, 2023

(54) SEMICONDUCTOR DEVICE AND METHOD OF MANUFACTURING SEMICONDUCTOR DEVICE

(71) Applicant: LAPIS SEMICONDUCTOR CO., LTD., Kanagawa (JP)

(72) Inventor: Takamitsu Furukawa, Miyazaki (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 17/211,915

(22) Filed: Mar. 25, 2021

(65) Prior Publication Data
US 2021/0305355 A1 Sep. 30, 2021

(30) Foreign Application Priority Data

Mar. 26, 2020 (JP) .............................. JP2020-056789

(51) Int. Cl.
*H01L 49/02* (2006.01)
*H01L 23/522* (2006.01)
*H01L 27/08* (2006.01)

(52) U.S. Cl.
CPC .......... *H01L 28/10* (2013.01); *H01L 23/5227* (2013.01); *H01L 27/08* (2013.01)

(58) Field of Classification Search
CPC ..... H01L 28/10; H01L 23/5227; H01L 27/08; H01L 2924/3011; H01L 23/645; H01F 17/0006
USPC ........................................ 257/531; 438/957
See application file for complete search history.

(56) References Cited

U.S. PATENT DOCUMENTS

2010/0314714 A1* 12/2010 Nakamura .......... H01L 23/5227
257/531

FOREIGN PATENT DOCUMENTS

JP 2004-022906 A 1/2004
JP 2011-233807 A 11/2011

* cited by examiner

*Primary Examiner* — Thinh T Nguyen
(74) *Attorney, Agent, or Firm* — Volentine, Whitt & Francos, PLLC (57) ABSTRACT

A semiconductor device including: a semiconductor substrate; a seed layer that is formed on the semiconductor substrate; and wiring that is formed on the seed layer and includes parallel row portions that are arranged at intervals from each other, and in which penetration passages that penetrate the parallel row portions in a direction in which the parallel rows lined up are formed in the parallel row portions.

6 Claims, 12 Drawing Sheets

SEMICONDUCTOR DEVICE AND METHOD OF MANUFACTURING SEMICONDUCTOR DEVICE

CROSS-REFERENCE TO RELATED APPLICATION

This application is based on and claims priority under 35 USC 119 from Japanese Patent Application No. 2020-056789 filed on Mar. 26, 2020, the disclosure of which is incorporated by reference herein.

BACKGROUND

Technical Field

The present disclosure relates to a semiconductor device and to a method of manufacturing a semiconductor device.

Related Art

In recent years, in conjunction with increasing levels of integration, functionality, and miniaturization of semiconductor devices, a wiring structure has begun to be employed in which the wiring is embedded in grooves, and copper, for example, is used for the wiring material.

In order to create this structure, after a seed layer has been deposited on a semiconductor substrate, grooves are formed therein using processes such as lithography and dry etching. The wiring is then formed, for example, by depositing copper using an electroplating method or the like so that the copper fills the previously created grooves (see, for example, Japanese Unexamined Patent Application Laid-Open (JP-A) Nos. 2011-233807 and 2004-22906).

In the publications of JP-A Nos. 2011-233807 and 2004-22906, inventions are disclosed relating to semiconductor devices in which inductor areas are formed using wiring patterns.

In the invention disclosed in JP-A No. 2011-233807, using a damascene process to form a helical inductor area is disclosed.

Moreover, in the invention disclosed in JP-A No. 2004-22906, forming a partially notched circular inductor area by performing wet etching on a Cu film that was formed using an electroplating method is disclosed.

A method of forming a helical inductor area such as that described in JP-A No. 2011-233807 using an electroplating process such as that described in JP-A No. 2004-22906 will now be described using FIG. 11 through FIG. 18.

Figure 11:
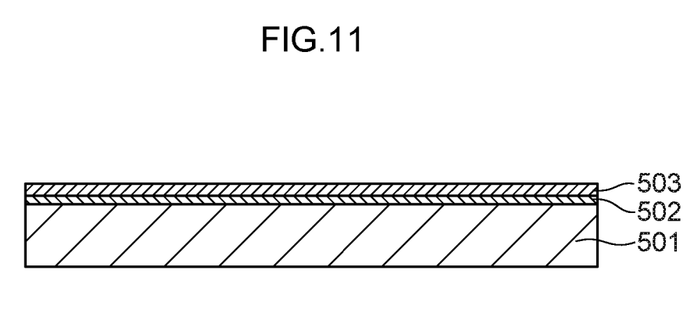
FIG. 11 is a cross-sectional view showing a state in which a seed layer is provided on a semiconductor substrate in an example of a method of manufacturing a semiconductor device according to a conventional exemplary embodiment.

As is shown in FIG. 11, a Ti seed layer 502 is formed on a semiconductor substrate 501, and a copper seed layer 503 is then formed on the Ti seed layer 502.

In addition to fulfilling a role as a cathode for the electroplating process, these seed layers also have a function of adhesive agents that stabilize the adhesive strength between themselves and the semiconductor substrate 501. As a result of a seed layer being provided, the electroplating is able to provide a high degree of reliability and stable adhesive properties.

Figure 12:
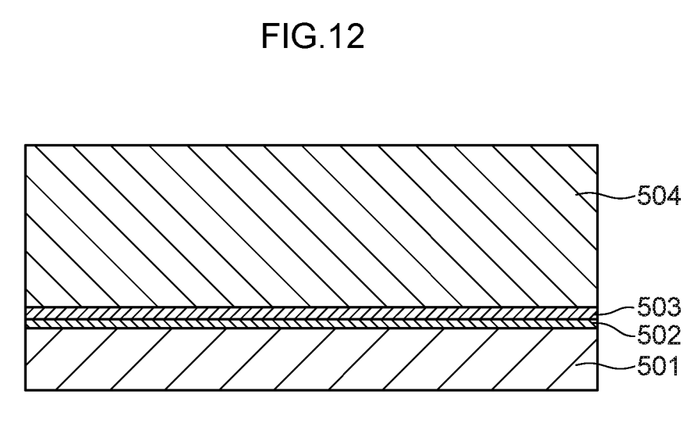
FIG. 12 is a cross-sectional view showing a state in which resist has been coated in the example of the method of manufacturing a semiconductor device according to the conventional exemplary embodiment.

Next, as is shown in FIG. 12, resist is coated to a predetermined thickness onto the Cu seed layer 503.

Figure 13:
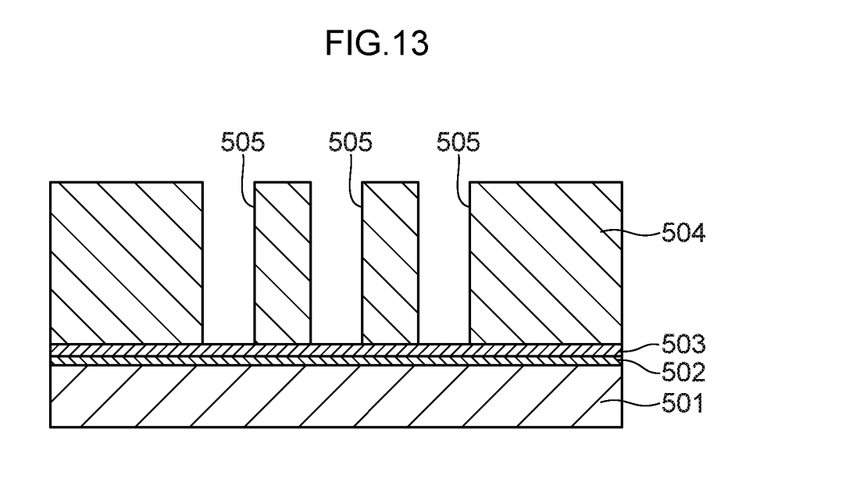
FIG. 13 is a cross-sectional view showing a state after resist has been exposed in the example of the method of manufacturing a semiconductor device according to the conventional exemplary embodiment.

Next, using photolithography, the resist is exposed using a mask component, and the exposed resist is then removed. As a result, a resist pattern having opening grooves 505 such as that shown in FIG. 13 is formed.

Figure 14:
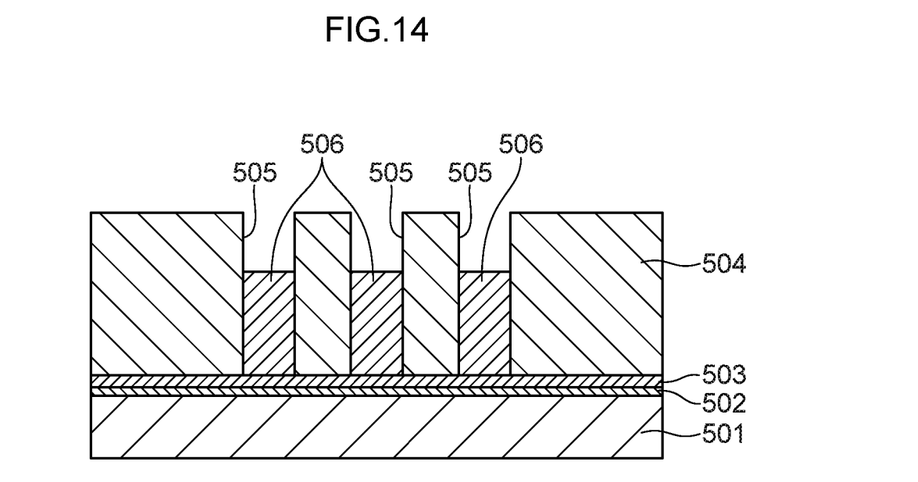
FIG. 14 is a cross-sectional view showing a state in which wiring has been provided via an electroplating process in the example of the method of manufacturing a semiconductor device according to the conventional exemplary embodiment.
Figure 15:
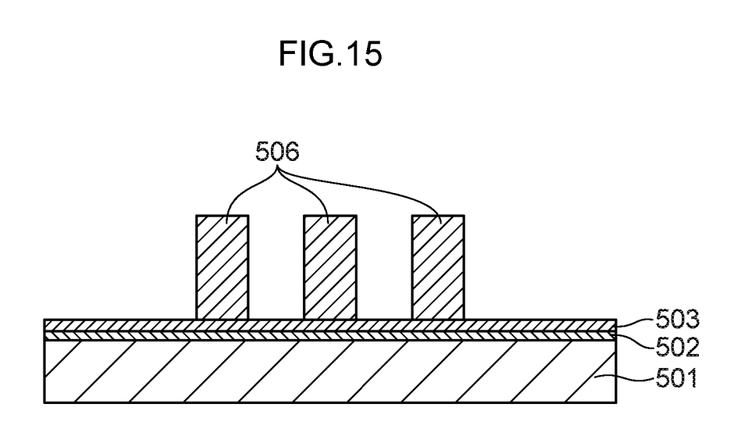
FIG. 15 is a cross-sectional view showing a state after resist has been removed in the example of the method of manufacturing a semiconductor device according to the conventional exemplary embodiment.

As is shown in FIG. 14, wiring 506 that is formed from Cu plating is then formed inside the opening grooves 505 using an electroplating process. Once the wiring 506 has been formed, by then removing the resist 504 using an organic solvent or the like, an inductor area formed by the wiring 506 such as that shown in FIG. 15 is formed.

Figure 16:
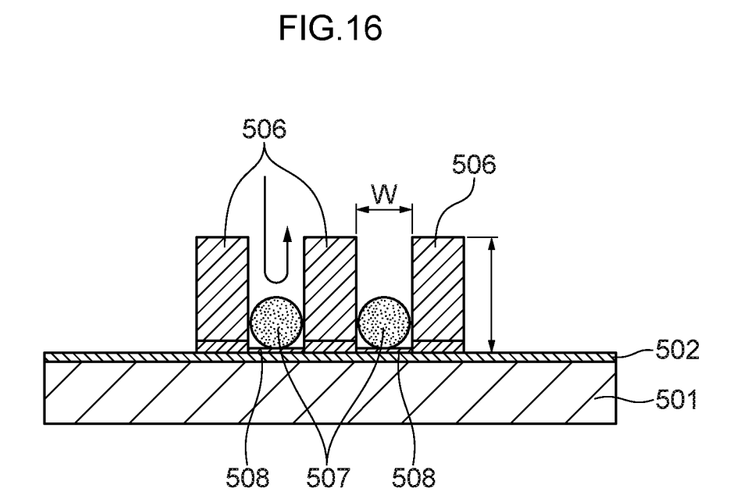
FIG. 16 is a cross-sectional view showing a state after etching of a Cu seed layer has been performed in the example of the method of manufacturing a semiconductor device according to the conventional exemplary embodiment.

Next, as is shown in FIG. 16, removal of the Cu seed layer 503 is performed using wet etching. However, a width W of intervals between mutually adjacent wiring 506 is narrow, so that it is not possible for dissolution material 507 to flow out from between the mutually adjacent wiring 506 so that this dissolution material 507 remains between the mutually adjacent wiring 506. Because of this, the etching rate of the wet etching is poor, and Cu residue 508 is generated in lower portions between the mutually adjacent wiring 506.

Figure 17:
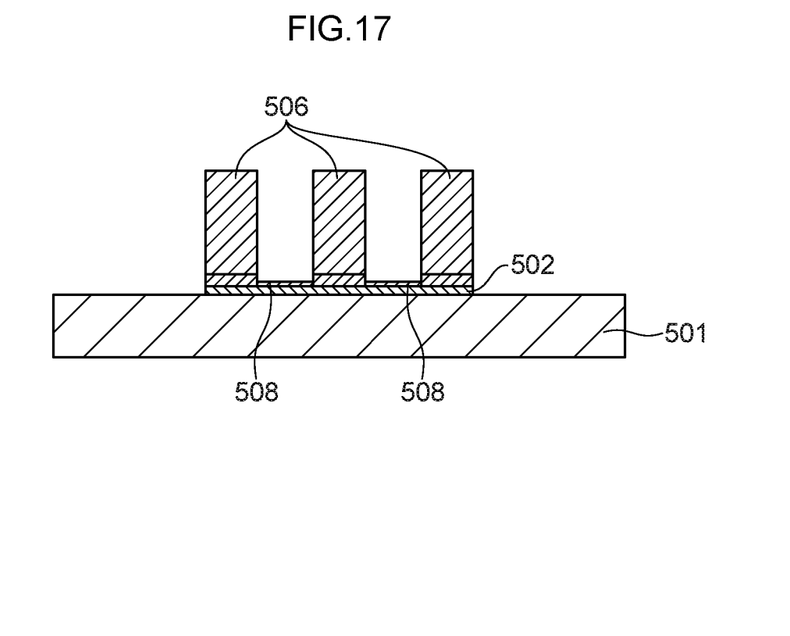
FIG. 17 is a cross-sectional view showing a state after etching of a Ti seed layer has been performed in the example of the method of manufacturing a semiconductor device according to the conventional exemplary embodiment.

In this state, as is shown in FIG. 17, even if removal of the Ti seed 502 is performed using wet etching, the Cu residue 508 remaining in the lower portions between the mutually adjacent wiring 506 acts as a mask, so that the Ti seed layer 502 underneath the Cu residue 508 is not etched, but remains behind.

Figure 18:
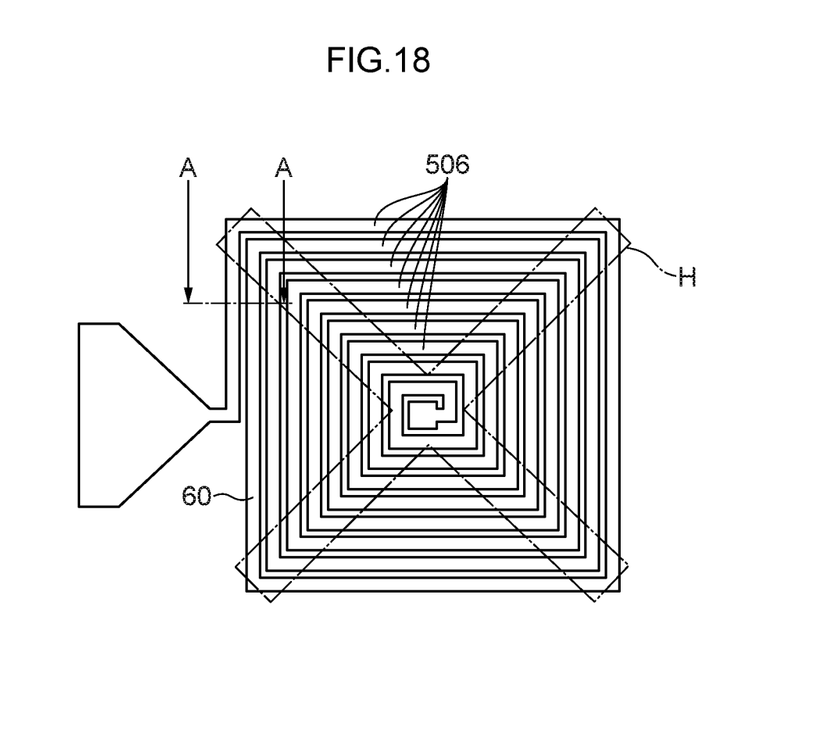
FIG. 18 is a plan view showing an inductor area in the example of the method of manufacturing a semiconductor device according to the conventional exemplary embodiment.

FIG. 18 is a plan view showing this inductor area. The locations shown in FIG. 11 through FIG. 17 are shown in cross-sectional views taken across a line A-A in FIG. 18.

As can be understood by looking at the placement of the wiring 506 in the inductor area in FIG. 18, intervals between the mutually adjacent wiring 506 are narrow, and the space between mutually adjacent wiring 506 is extremely limited. Consequently, it is easy for the dissolution material 507 to accumulate in the narrow space between mutually adjacent wiring 506 so that a state in which it is easy for Cu residue 508 to occur is generated.

If the duration of the Cu etching is prolonged until the Cu residue 508 is removed, then the Cu of the wiring 506 is also etched, and defects such as the width of the wiring 506 becoming too narrow occur.

SUMMARY

The present disclosure was conceived in view of the above-described circumstances, and it is an object thereof to prevent defects such as the width of wiring becoming too narrow from occurring.

A semiconductor device according to the present disclosure is provided with a semiconductor substrate, a seed layer that is formed on the semiconductor substrate, and wiring that is formed on the seed layer and includes parallel row portions that are arranged at intervals from each other, and in which penetration passages that penetrate the parallel row portions in a direction in which the parallel rows lined up are formed in the parallel row portions.

According to the present disclosure, wiring that is formed on the seed layer and includes parallel row portions that are arranged at intervals from each other has penetration passages that penetrate the parallel row portions in a direction in which the parallel rows lined up. As a result, if etching of the seed layer is performed, the fluid used for the etching flows through the penetration passages into the narrow spaces between mutually adjacent wiring so that the fluid is able to properly circulate through these spaces. Consequently, residual dissolution material can be prevented from accumulating in these spaces. As a result, it is possible to reduce any deterioration in the etching rate that is caused by residual dissolution material accumulating in the narrow spaces between mutually adjacent wiring.

Note that, here, the fluid used for the etching is a fluid that is used for wet etching, however, the present disclosure is not particularly limited to this, and the fluid used for the etching may instead be a gas that is used for dry etching.

Furthermore, in the semiconductor device according to the present disclosure, the height of the penetration passages is not less than 10% and not more than 15% of the height of the wiring.

According to the present disclosure, if the height of the penetration passages is less than 10% of the height of the wiring, then the ability of the etching fluid to flow through the penetration passages is reduced, and dissolution material as well as Cu residue ends up accumulating in the spaces between mutually adjacent wiring.

If, on the other hand, the height of the penetration passages exceeds 15% of the height of the wiring, then the resistance value of the wiring increases in conjunction with the reduction in the cross-sectional area of the wiring.

A method of manufacturing a semiconductor device according to the present disclosure includes forming a seed layer on a semiconductor substrate, coating resist on the seed layer, placing on the resist a mask component having a light shading portion that exposes the resist using a wiring pattern that represents a configuration of wiring while covering other portions of the resist, and linear portions that, when the configuration of the wiring is looked at in plan view, cover the resist over parallel row portions that are lined up at intervals from each other, forming a resist pattern in which, while the wiring pattern is left open by exposing the resist using the mask component, the resists that are lined up at intervals from each other so as to correspond to the parallel row portions are connected together linearly in a bottom portion of the openings by the linear portions, forming wiring in the locations that have been opened by removing the resist from the seed layer in the resist pattern, and removing the seed layer by etching.

According to the present disclosure, by forming a seed layer on a semiconductor substrate and then coating resist onto the seed layer, and by then using a mask component having a light shading portion that exposes the resist using a wiring pattern that represents a configuration of wiring while covering other portions of the resist, and linear portions that, when the configuration of the wiring is looked at in plan view, cover the resist over parallel row portions that are lined up at intervals from each other, it is possible to form a resist pattern in the resist on the seed layer.

The wiring is then formed on the semiconductor substrate by forming wiring in the locations that have been opened by removing the resist from the seed layer in the resist pattern, and then removing the seed layer by etching.

Furthermore, the method of manufacturing a semiconductor device according to the present disclosure is characterized in that the linear portions are formed as single linear bodies having a width that is less than a resolution limit of an exposure device.

According to the present disclosure, by forming the linear portions as single linear bodies having a width that is less than a resolution limit of an exposure device, using these linear portions it is possible to form linear resists having a desired height.

Using these linear resists, it is possible to form penetration passages that penetrate parallel row portions of the wiring, which are lined up at intervals from each other, in the direction in which these parallel rows are lined up adjacently to each other.

As a result of these penetration passages being formed, a fluid such as etching solution and the like that is used during etching flows through the penetration passages so that residual dissolution material is prevented from accumulating between mutually adjacent wiring, and any reduction in the etching rate between mutually adjacent wiring is also prevented, and Cu residue can be prevented from accumulating between mutually adjacent wiring. As a result, it is possible to prevent such Cu residue from acting as a mask and obstructing the etching of the seed layer, so that a superior etching performance can be obtained.

The method of manufacturing a semiconductor device according to the present disclosure is further characterized in that the linear portions contain a plurality of linear bodies that have a width that is less than the resolution limit of the exposure device, and are disposed at intervals from each other that are narrower than the resolution limit.

In the present disclosure, the linear portions contain a plurality of linear bodies that have a width that is less than the resolution limit of the exposure device, and are disposed at intervals from each other that are narrower than the resolution limit. Because of this, by increasing or decreasing the number of these linear bodies, it is possible to form linear portions having the desired width.

According to the present disclosure, residual dissolution material can be prevented from accumulating as a result of the penetration passages being provided, and a reduction in the etching rate that results from the accumulation of such dissolution material can also be prevented, and the accumulation of Cu residue between mutually adjacent wiring can also be prevented so that, as a result, defects such as the width of the wiring becoming too narrow can be prevented from occurring.

BRIEF DESCRIPTION OF THE DRAWINGS

Exemplary embodiments of the present disclosure will be described in detail based on the following figures, wherein.

DETAILED DESCRIPTION

First Exemplary Embodiment

Hereinafter, a first exemplary embodiment of the present disclosure will be described with reference to the drawings. Note that, in each of the drawings, the same reference symbols are used to indicate component elements or portions that are essentially the same as or equivalent to each other.

Moreover, in the present specification, in a case in which a numerical range is expressed using the symbol [-], then this means that the range contains the numbers used before and after the [-] as a lower limit value and an upper limit value.

In the present specification, an expression 'above' a structure A is not only used for cases in which an object is positioned above, and in contact with the structure A, but may also be used for cases in which an object is located above the structure A via a separate structure B.

Figure 1:
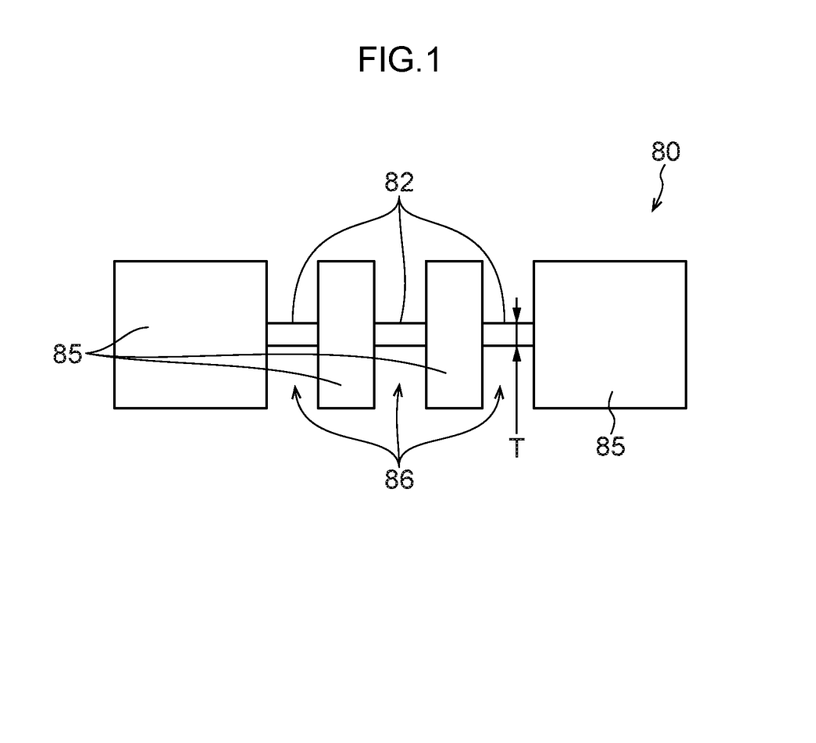
FIG. 1 is a plan view showing a mask component in an example of a method of manufacturing a semiconductor device according to a first exemplary embodiment of the present disclosure.

FIG. 1 is a plan view showing a mask component 80 which is used in a photolithographic process in a method of manufacturing a semiconductor device 10 according to an exemplary embodiment of the present disclosure.

The mask component 80 shown in the drawings is only a representative portion of the entire mask component 80.

The mask component 80 is formed by light shielding portions 85 that do not allow light from an exposure device used in photolithography to be transmitted, and transmitting portions 86 that do allow this light to be transmitted.

The transmitting portions 86 are formed in order to expose resist 40 using a wiring pattern that represents a configuration of wiring 60. The light shielding portions 85 are formed in order to cover portions of the resist 40 other than the portions thereof that are to be exposed by the transmitting portions 86.

More specifically, the mask component 80 shown in FIG. 1 is used to form the wiring 60 which is formed by plating Cu 42 (described below) in an inductor area.

The three transmitting portions 86 shown in the center in FIG. 1 are used to form the wiring 60 of the inductor area (described below). Linear portions 82 are formed extending to the left and right in the center of the mask component 80 shown in FIG. 1.

The linear portions 82 are used to form penetration passages 70 within the wiring 60 that is made from the plating Cu 42 (described below). A width T of the linear portions 82 is set to a width that is less than a resolution limit (what is known as a 'minimum line width) of the exposure device (what is known as a 1× projection exposure device of a semiconductor manufacturing device) used in the photolithographic process to manufacture the semiconductor device 10. In the present exemplary embodiment, the width T is set to 1-2 µm.

Figure 2:
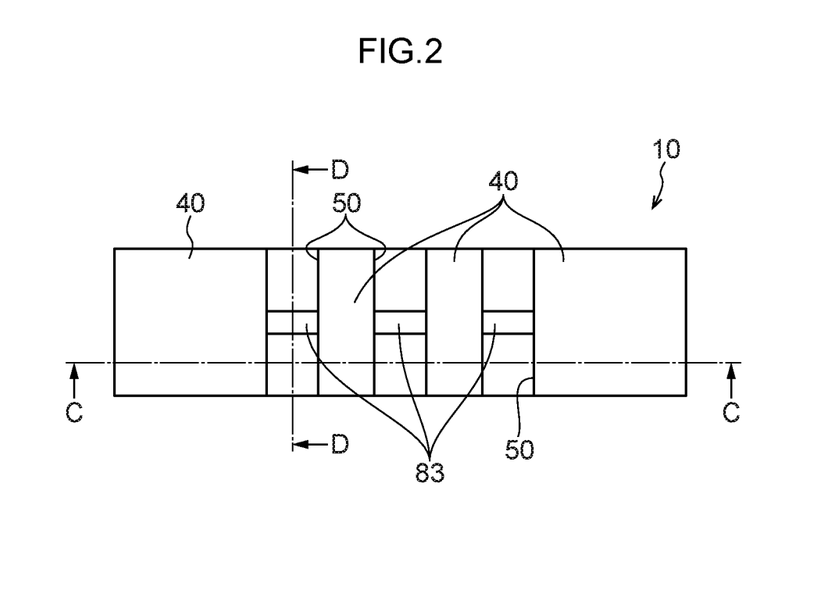
FIG. 2 is a plan view showing a state after photolithography has been performed in the example of the method of manufacturing a semiconductor device according to the first exemplary embodiment of the present disclosure.

In a typical method used to form conventional embedded type wiring, in the same way as was described using FIG. 11, a Ti seed layer 20 is formed on a semiconductor substrate 11, and a Cu seed layer 30 is formed on this Ti seed layer 20. In addition, in the same way as was described using FIG. 12, resist 40 is coated to a predetermined thickness onto the Cu seed layer 30, and then, using the mask component 80 shown in FIG. 1, employing photolithography, the resist 40 is exposed using the aforementioned exposure device, and the exposed resist 40 is then removed. As a result, a state such as that shown in plan view in FIG. 2 is obtained. The linear resists 83 are formed by the above-described linear portions 82.

In the state after this photolithography which is shown in the plan view in FIG. 2, if Cu plating is carried out via an electroplating method, then as is shown in the cross-sectional view in FIG. 3, the plating Cu 42 fills the interiors of opening grooves 50. Note that, in the present specification, a downward-facing direction as seen in the cross-sectional diagrams corresponds to the direction of gravity.

Figure 3A:
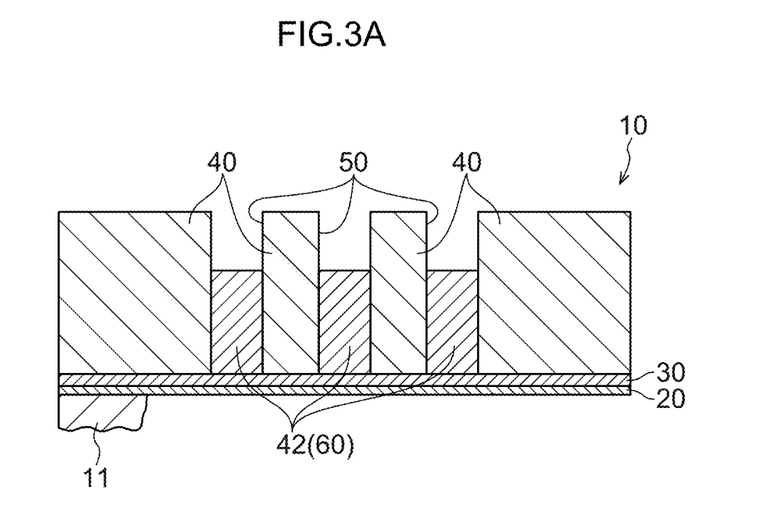
FIG. 3A is a cross-sectional view at a position of a line C-C shown in FIG. 2 after Cu plating has been performed from the state shown in FIG. 2 in the example of the method of manufacturing a semiconductor device according to the first exemplary embodiment of the present disclosure.
Figure 3B:
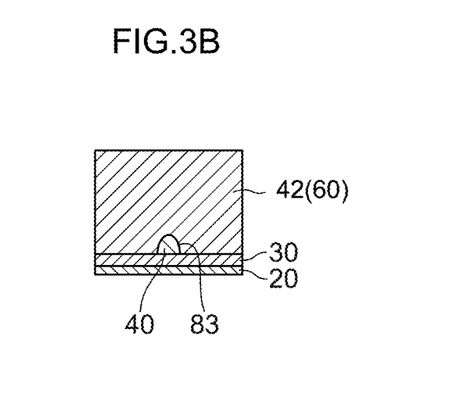
FIG. 3B is a cross-sectional view at a position of a line D-D shown in FIG. 2 after Cu plating has been performed from the state shown in FIG. 2.

A cross-sectional view at a position of a line C-C shown in FIG. 2 after the Cu plating has been performed from the state shown in FIG. 2 is shown in FIG. 3A, while a cross-sectional view at a position of a line D-D shown in FIG. 2 after the Cu plating has been performed from the state shown in FIG. 2 is shown in FIG. 3B.

The plating Cu 42 that has filled the interior of the opening grooves 50 forms the wiring 60 in the inductor area.

The linear resists 83 that are formed by the linear portions 82 remain on top of the Cu seed layer 30 in the lower portion of the wiring 60 extending in a direction that is orthogonal to (i.e., that intersects) the longitudinal direction of the wiring 60 (i.e., the direction in which the wiring 60 extends). As a result of these linear resists 83 remaining, the plating Cu 42 does not fill the interior of the wiring 60 that is formed by the plating Cu 42, and instead of this, the penetration passages 70 (described below) are formed as tunnel-shaped cavities.

Figure 4A:
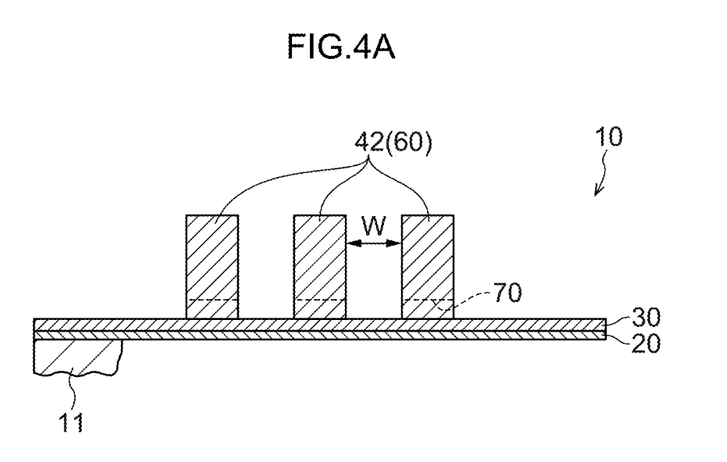
FIG. 4A is a cross-sectional view at the position of the line C-C shown in FIG. 2 when resist has been removed in the example of the method of manufacturing a semiconductor device according to the first exemplary embodiment of the present disclosure.

From the states shown in FIG. 3A and FIG. 3B, the resist 40 is then removed using an organic solvent or the like. As a result, as is shown in FIG. 4A, the wiring 60 which includes parallel row portions that are lined up at intervals from each other is formed on the Cu seed layer 30 by the plating Cu 42. By then removing the linear resists 83 that penetrate the parallel row portions in the direction in which the parallel rows are lined up next to each other, the penetration passages 70 that are the internal portions of the wiring 60 which is formed by the plating Cu 42, and that penetrate the wiring 60 in a direction that is orthogonal to (i.e., that intersects) the longitudinal direction of the wiring 60 (i.e., the direction in which the wiring 60 extends) on the Cu seed layer 30, in other words, that penetrate the parallel row portions of the plating Cu 42, which are lined up at intervals from each other, in the direction in which the parallel rows are lined up next to each other. As a result, an inductor area is formed by the wiring 60 having the penetration passages 70. Note that the wiring 60 may be formed in a variety of configurations such as a stretched configuration, a curved configuration, or a bent configuration. Among these, the parallel row portions correspond to the portions indicated by the reference number 42 in FIG. 3.

Figure 4B:
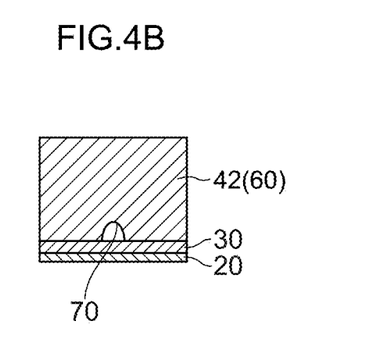
FIG. 4B is a cross-sectional view at the position of the line D-D shown in FIG. 2 when resist has been removed.

From the states shown in FIG. 4A and FIG. 4B, the Cu seed layer 30 is removed via wet etching using an etching solution. In the present exemplary embodiment, for example, an acid-based solution having sulfuric acid as its principal constituent is used for the etching solution, however, provided that the solution is able to remove the Cu seed layer 30, then it is not particularly restricted.

Figure 5:
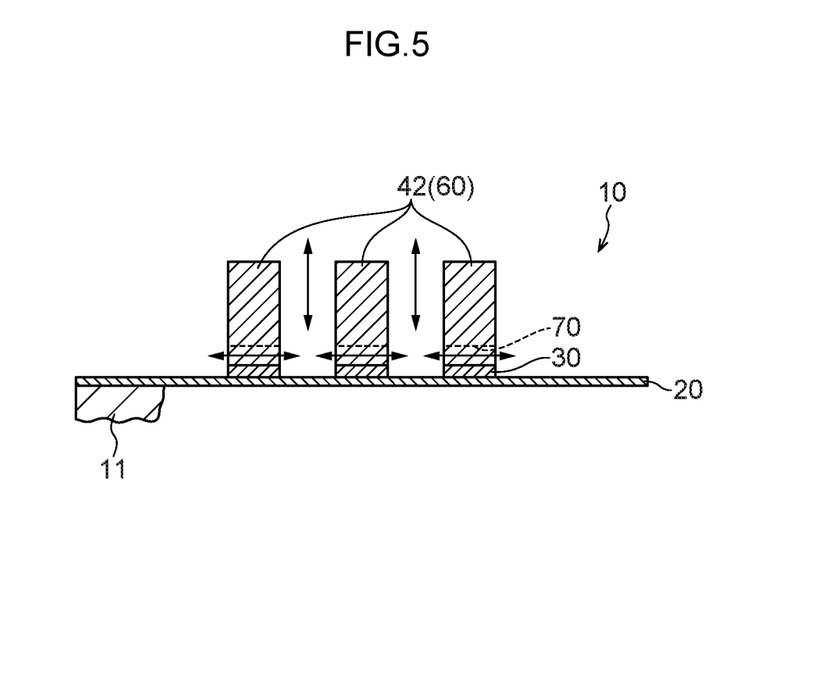
FIG. 5 is a cross-sectional view showing a state after etching of a Cu seed layer has been performed in the example of the method of manufacturing a semiconductor device according to the first exemplary embodiment of the present disclosure.

Here, in the method of manufacturing the semiconductor device 10 according to the present exemplary embodiment shown in FIG. 4A and FIG. 4B as well, the width W of the intervals between mutually adjacent wiring 60 forming the inductor area is narrow, in the same way as was described for the conventional technology shown in FIG. 16, however, as is shown in FIG. 5, by forming the penetration passages 70 that are shaped as tunnels that penetrate the lower portion of the wiring 60 in a direction that is orthogonal to (i.e., that intersects) the longitudinal direction of the wiring 60 (i.e., the direction in which the wiring 60 extends), there is no residual dissolution material such as in the conventional technology described in FIG. 16. Accordingly, a flow of fluid such as etching solution and the like is generated during the wet etching in the left-right directions and up-down directions shown in FIG. 5, and dissolution material, such as that described in the case of the conventional technology, is discharged to the outside by the flow of this fluid, and it is possible to prevent residual dissolution material from accumulating in the narrow spaces between mutually adjacent wiring 60.

In the mask component 80 according to the present exemplary embodiment, as is described above, the width T of the linear portions 82 that are used to form the penetration passages 70 is set, for example, to 1-2 μm.

By using the above-described type of mask component 80, the semiconductor device 10 according to the present exemplary embodiment is formed such that the height of the penetration passages 70 is not less than 10% and not more than 15% of the height of the plating Cu 42 forming the wiring 60.

According to the present exemplary embodiment, if the height of the penetration passages 70 is less than 10% of the height of the wiring 60, then the ability of the etching fluid to flow through the penetration passages 70 is reduced, and dissolution material as well as Cu residue ends up accumulating between mutually adjacent wiring 60.

If, on the other hand, the height of the penetration passages 70 exceeds 15% of the height of the wiring 60, then the resistance value of the wiring 60 increases in conjunction with the reduction in the cross-sectional area of the wiring 60.

The intervals between the penetration passages 70 in the longitudinal direction (i.e., the extension direction) of the wiring 60 in the semiconductor device 10 according to the present exemplary embodiment are formed such that, in an inductor area such as that shown in FIG. 18, compared with areas in which the lengths of wiring 60, which have been arranged in parallel rows, are formed so as to be rectilinear (more specifically, in areas other than the area H shown by the single-dot chain line in FIG. 18), in corner locations where the lengths of wiring 60, which are arranged in parallel rows, are bent at right angles (more specifically, in the area H shown by the single-dot chain line in FIG. 18) the placement intervals between adjacent penetration passages 70 is narrow relative to the longitudinal direction (i.e., the extension direction) of the wiring 60 so that the distribution density of the penetration passages 70 is higher.

This structure is employed so that, in locations where the longitudinal direction (i.e., the extension direction) of the lengths of wiring 60, which are arranged in parallel rows, is formed so as to be rectilinear (more specifically, in areas other than the area H shown by the single-dot chain line in FIG. 18), the flow of fluid such as etching solution that is used for etching during dry etching and the like is also not obstructed, and dissolution material between the wiring 60 is able to be easily discharged. In contrast, in corner portions such as the corner locations where the lengths of wiring 60, which are arranged in parallel rows, are bent at right angles (more specifically, in the area H shown by the single-dot chain line in FIG. 18), the flow of fluid such as etching solution that is used for etching during dry etching and the like is obstructed by the corner portions, and there is a tendency for residual dissolution material residue to accumulate between mutually adjacent wiring 60. Because of this, in the corner locations of the wiring 60 (i.e., in the area H shown by the single-dot chain line), by narrowing the spacing between the penetration passages 70 so that they are distributed extremely densely, it is possible to facilitate the flow of the etching fluid and to inhibit any dissolution material residue from remaining between mutually adjacent wiring 60.

In the semiconductor device 10 and the method of manufacturing the same according to the present exemplary embodiment, by employing a structure such as that described above, effects and actions such as those described below can be demonstrated.

According to the present exemplary embodiment, as a result of the wiring 60 that has the parallel row portions which are arranged in rows at a distance from each other being provided with the penetration passages 70 that penetrate the parallel row portions in the direction in which the parallel rows are lined up next to each other, when the etching of the Cu seed layer 30 is being performed, the fluid used for the etching flows through the penetration passages 70 as far as the interior of the narrow spaces between mutually adjacent wiring 60 so that the fluid is able to properly flow (circulate) through these spaces. Consequently, residual dissolution material can be prevented from accumulating in these spaces. As a result, it is possible to reduce any deterioration in the etching rate that is caused by residual dissolution material accumulating in the narrow spaces between the mutually adjacent wiring 60.

According to the present exemplary embodiment, by forming a seed layer (i.e., the Ti seed layer 20 or the Cu seed layer 30) on the semiconductor substrate 11 and then coating resist 40 onto the seed layer, it is possible, by employing photolithography, to form a resist pattern in the resist 40 on the seed layer using the mask component 80 that partially exposes the resist 40.

Here, the mask component 80 has the light shielding portions 85 that, in order to expose the resist 40 using a wiring pattern that represents the configuration of the wiring 60, cover all the other portions of the resist 40, and the linear portions 82 that, when the configuration of the wiring 60 is looked at in plan view, cover a predetermined width (more specifically, a width that is less than the resolution limit of the exposure device) of the resist 40 over parallel row portions that are lined up at intervals from each other.

By exposing the resist 40 using the above-described type of mask component 80, a resist pattern is formed in which, at the same time as the wiring pattern is opened up, bottom portions of the openings between resists 40 that are lined up at intervals from each other so as to correspond to the parallel row portions are connected together linearly.

Moreover, by forming the wiring 60 using an electroplating method from the plating Cu 42 in the locations that have been opened up as a result of the resist 40 being removed from on top of the seed layer in the resist pattern, and then performing wet etching so as to remove the seed layer, it is possible to form the wiring 60 on the semiconductor substrate 11.

According to the present exemplary embodiment, as a result of the linear portions 82 being formed as a single linear body having a width that is less than the resolution limit of the exposure device, it is possible to form linear resists 40 having a desired height using the linear portions 82. Using these linear resists 40, the penetration passages 70 that penetrate parallel row portions of the wiring 60, which are lined up at intervals from each other, in the direction in which these parallel rows are lined up adjacently to each other can be formed.

According to the present exemplary embodiment, by forming the penetration passages 70 that penetrate parallel row portions of the wiring 60, which are lined up at intervals from each other, in the direction in which these parallel rows are lined up adjacently to each other, a fluid such as etching solution and the like that is used during etching flows through the penetration passages 70 so that residual dissolution material is prevented from accumulating between mutually adjacent wiring 60, and any reduction in the etching rate between mutually adjacent wiring 60 is also prevented, and Cu residue can be prevented from accumulating between mutually adjacent wiring 60. As a result, it is possible to prevent such Cu residue from acting as a mask and obstructing the etching of the seed layer, so that a superior etching performance can be obtained.

By making it possible to obtain a superior etching performance, there is no need for etching to be performed excessively. As a result, it is possible to prevent defects such as the width of the wiring 60 being reduced by excessive etching from occurring.

Second Exemplary Embodiment

As is shown in FIG. 1, in the first exemplary embodiment, in order to form a single penetration passage 70, a single linear portion 82 is formed using the mask component 80, however, in the present exemplary embodiment, by arranging a plurality of linear portions 82 having a narrower width than those of the first exemplary embodiment (more specifically, a width of approximately 0.5 μm, which width is less than the resolution limit) in parallel rows at intervals from each other that are less than this resolution limit, penetration passages 70 such as those shown in FIG. 7 through FIG. 9B that have a larger width than those of the first exemplary embodiment are formed.

Figure 6:
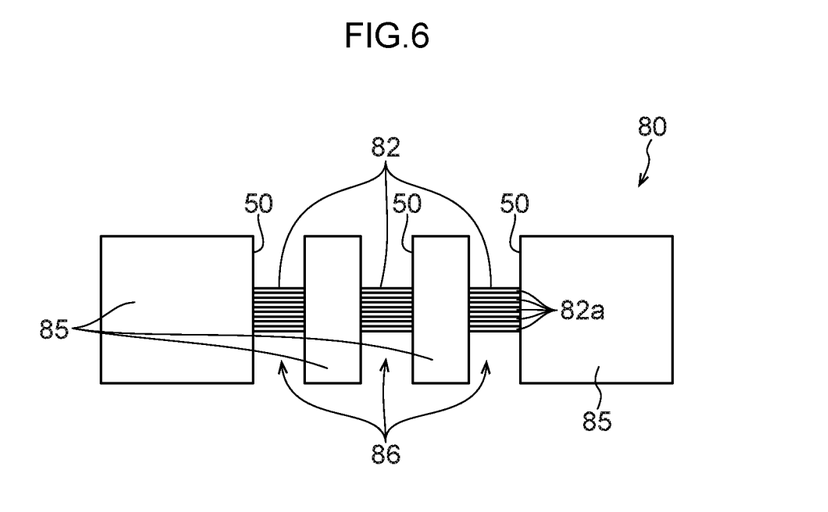
FIG. 6 is a plan view showing a mask component in an example of a method of manufacturing a semiconductor device according to a second exemplary embodiment of the present disclosure.
Figure 7:
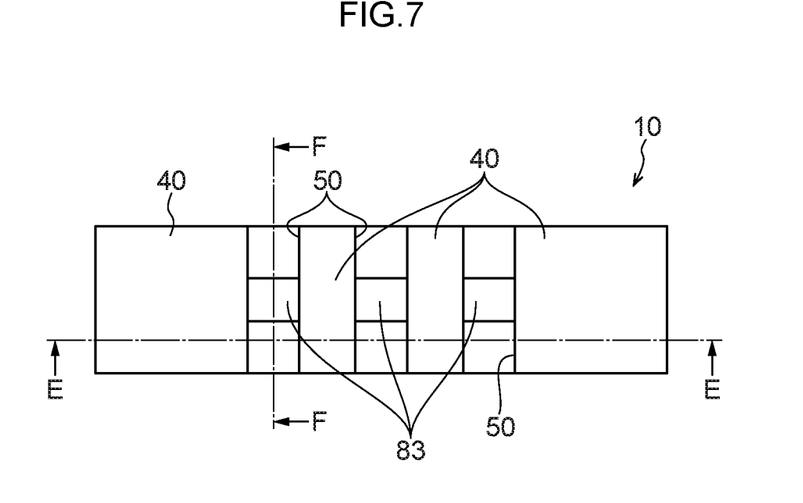
FIG. 7 is a plan view showing a state after photolithography has been performed in the example of the method of manufacturing a semiconductor device according to the second exemplary embodiment of the present disclosure.

More specifically, as is shown in FIG. 6, by using a mask component 80 in which a plurality of linear bodies 82a whose width is less than the resolution limit are arranged in parallel rows at intervals from each other that are smaller than this resolution limit, as is shown in the plan view in FIG. 7, after performing photolithography using this mask component 80 linear resists 83 are formed whose width is wider than in the first exemplary embodiment.

Figure 8A:
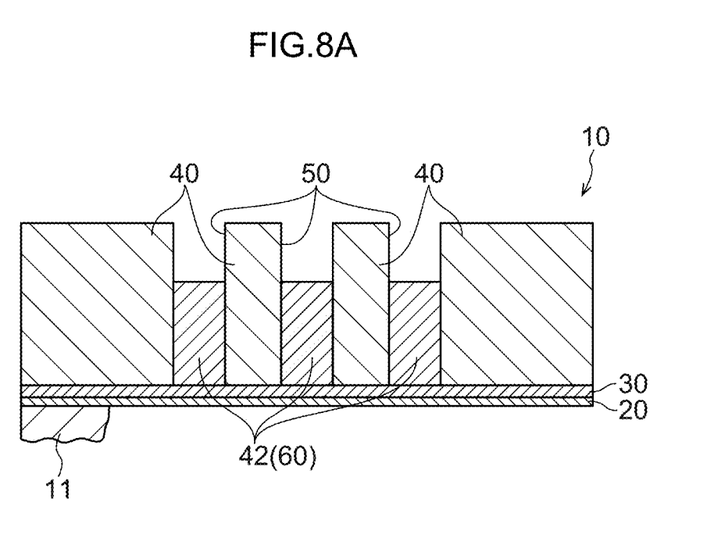
FIG. 8A is a cross-sectional view at a position of a line E-E shown in FIG. 7 after Cu plating has been performed from the state shown in FIG. 7 in the example of the method of manufacturing a semiconductor device according to the second exemplary embodiment of the present disclosure.
Figure 8B:
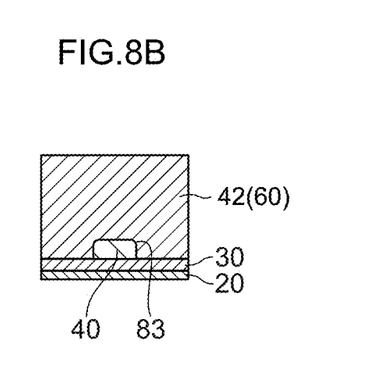
FIG. 8B is a cross-sectional view at a position of a line F-F shown in FIG. 7 after Cu plating has been performed from the state shown in FIG. 7.

In the same way as in the first exemplary embodiment, if Cu plating is performed using an electroplating method in the state shown in FIG. 7 after the photolithography has been performed, then as is shown in the cross-sectional views in FIG. 8A and FIG. 8B, the Cu plating 42 fills the interior of the opening grooves 50.

A cross-section at the position of the line E-E in FIG. 7 after the Cu plating has been performed from the state shown in FIG. 7 is shown in FIG. 8A, and a cross-section at the position of the line F-F in FIG. 7 after the Cu plating has been performed from the state shown in FIG. 7 is shown in FIG. 8B.

The plating Cu 42 that has filled the interior of the opening grooves 50 forms the wiring 60 in the inductor area.

Figure 9A:
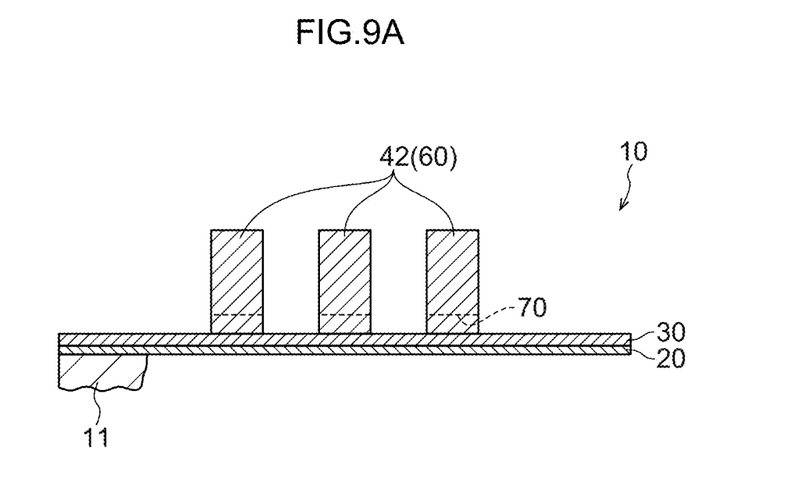
FIG. 9A is a cross-sectional view at the position of the line E-E shown in FIG. 7 when resist has been removed in the example of the method of manufacturing a semiconductor device according to the second exemplary embodiment of the present disclosure.
Figure 9B:
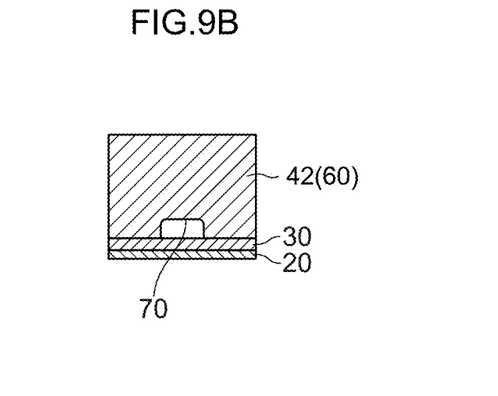
FIG. 9B is a cross-sectional view at the position of the line F-F shown in FIG. 7 when resist has been removed.
Figure 10:
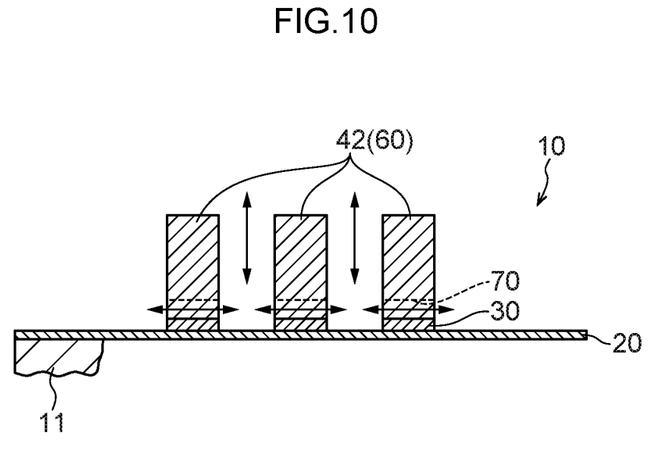
FIG. 10 is a cross-sectional view showing a state after etching of a Cu seed layer has been performed in the example of the method of manufacturing a semiconductor device according to the second exemplary embodiment of the present disclosure.

The linear resists 83 that are formed in the linear portions 82 that are wider than those of the first exemplary embodiment are left on top of the Cu seed layer 30 in the lower portion of the wiring 60 extending in a direction that is orthogonal to (i.e., that intersects) the longitudinal direction of the wiring 60 (i.e., the direction in which the wiring 60 extends). As a result of these linear resists 83 remaining, as is shown in FIG. 9A, the plating Cu 42 does not fill the interior of the wiring 60 that is formed by the plating Cu 42, and instead of this, the penetration passages 70 are formed as tunnel-shaped cavities.

In the present exemplary embodiment, if the linear bodies 82a whose width is less than the resolution limit of the exposure device are arranged at intervals from each other that are smaller than this resolution limit, then by increasing or decreasing the number of these linear bodies 82a, it is possible to more precisely control the width and height of the linear resists 83 and the penetration passages 70 than in the first exemplary embodiment. Consequently, it is possible to form linear portions 82 and linear resists 83 that have a desired width, and as a result, it is also possible to form penetration passages 70 that also have a desired width and height.

The remaining structure is similar to that described in the first exemplary embodiment, and the actions and effects obtained from this structure are also similar to the actions and effects obtained from the first exemplary embodiment. Therefore, a description of these is not given here.

Exemplary embodiments of the present disclosure have been described above, however, the present disclosure is not limited to these. Various modifications and the like may be made to the present disclosure insofar as they do not depart from the spirit or scope of the present disclosure.

What is claimed is:

1. A semiconductor device comprising:
   a semiconductor substrate;
   a seed layer that is formed on the semiconductor substrate; and
   wiring that is formed on the seed layer and includes parallel row portions that are arranged at intervals from each other,
   the wiring including penetration passages that penetrate through the parallel row portions as tunnels in a direction that is orthogonal to a direction in which the parallel rows extend.

2. The semiconductor device according to claim 1, wherein a height of the penetration passages is not less than 10% and not more than 15% of a height of the wiring.

3. The semiconductor device according to claim 1, wherein the wiring is configured as an inductor.

4. The semiconductor device according to claim 1, wherein the wiring comprises copper plating.

5. The semiconductor device according to claim 4, wherein the wiring further comprises a titanium seed layer.

6. The semiconductor device according to claim 5, wherein the penetration passages penetrate through the copper plating.

* * * * *